(12) United States Patent
Maruyama

(10) Patent No.: US 6,404,036 B2
(45) Date of Patent: Jun. 11, 2002

(54) SEMICONDUCTOR MEMORY DEVICE WITH A TRIPLE WELL STRUCTURE

(75) Inventor: Akemi Maruyama, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/742,351

(22) Filed: Dec. 22, 2000

(30) Foreign Application Priority Data

Dec. 22, 1999 (JP) .......................................... 11-365632

(51) Int. Cl.$^7$ .......................... H01L 29/00; H01L 29/94
(52) U.S. Cl. ........................ 257/548; 257/296; 257/390; 257/544
(58) Field of Search ................................. 257/296, 390, 257/548, 544

(56) References Cited

U.S. PATENT DOCUMENTS 5,455,437 A * 10/1995 Komori et al. ............. 257/376
6,208,010 B1 * 3/2001 Nakazato et al. ........... 257/544
6,285,240 B1 * 9/2001 Shiau et al. ................ 327/536

* cited by examiner

*Primary Examiner*—Allan R. Wilson
(74) *Attorney, Agent, or Firm*—Young & Thompson

(57) ABSTRACT

The present invention provides a layout structure of an interconnection which feeds a fixed voltage level to a sense amplifier provided in a cell array block of a semiconductor memory device, wherein the interconnection selectively extends only an inside of an outside edge of a second conductivity type outside well region provided along one peripheral side of a first conductivity type well region, in which the cell array block is provided.

15 Claims, 8 Drawing Sheets

SEMICONDUCTOR MEMORY DEVICE WITH A TRIPLE WELL STRUCTURE

BACKGROUND OF THE INVENTION

The present invention relates to a DRAM with a triple well structure, and more particularly to a layout of a memory cell sub-array for a DRAM with a triple well structure.

For designing masks of the memory device, a high integration of the device is one of the important issues. It is the most important issue how to suppress the chip size with satisfying the requirement for the high integration.

The DRAM has the triple well structure and double-layered interconnections, wherein a top interconnection layer serves as a signal interconnection layer whilst a bottom interconnection layer serves as a power or ground layer.

FIG. 1A is a fragmentary plane view illustrative of the conventional triple well structure for DRAM. FIG. 1B is a fragmentary cross sectional elevation view illustrative of the conventional triple well structure for DRAM taken along a B–B' line of FIG. 1A. An n-type deep well region 2 is selectively formed in a cell array formation region of a p-type semiconductor substrate 1. A p-type shallow well region 3 is formed in a shallow region of the p-type semiconductor substrate 1. N-type isolation well regions 4 extend to surround a part of the p-type shallow well region 3 and isolates the part of the p-type shallow well region 3 from the p-type semiconductor substrate 1. The isolation well regions 4 reach the peripheral regions of the n-type deep well region 2. A memory cell and an n-channel transistor are formed in the defined p-type shallow well region 3. A p-channel transistor is formed in the n-type isolation well regions 4.

FIG. 2 is a fragmentary plane view illustrative of a cell array block having the conventional triple well structure shown in FIGS. 1A and 1B. In order to shrink a cell array block 200, a p-channel transistor SAP 241 is formed in a left side region of the n-type isolation well regions 204, whilst a p-channel transistor SAP 244 is formed in a right side region of the n-type isolation well regions 204. A memory cell array block 200 is accommodated in the p-type well 203. A p-channel transistor SAP241 (sense amplifier bank p-type transistor) for a sense amplifier bank 240 is formed in the left side region of the n-type isolation well regions 204 which are positioned in both sides of the p-well 203, in order to shrink the chip size. FIG. 3A is a fragmentary enlarged plane view illustrative of the left side region of the cell array block shown in FIG. 2. FIG. 3B is a fragmentary enlarged cross sectional elevation view taken along a C–C' line of FIG. 3A.

This layout, however, causes a disadvantage that the provision of the p-channel transistor SAP 241 in the left side region of the n-type isolation well regions 204 causes that a VINT2AL line 209 (a voltage feeding line internally by $2^{nd}$ aluminum VINT2AL209) necessary for the p-channel transistors SAP241–SAP244 extends to reach the left side edge, whereby an interconnection SA2AL210' connected with a GND line SA2AL210 extends beyond the n-type isolation well regions 204 which defines the cell array block 200. This means that no substantive shrinkage can be obtained.

In the above circumstances, it had been required to develop a novel layout for DRAM free from the above problem.

SUMMARY OF THE INVENTION

Accordingly, it is an object of the present invention to provide a novel layout for DRAM free from the above problems.

It is a further object of the present invention to provide a novel layout for DRAM having a triple well structure and double layered interconnections, wherein a bottom interconnection serves as a signal interconnection, whilst a top interconnection serves as a power line or a ground line, wherein the layout is optimum to realize a possible shrinkage by preventing and avoiding that the internal power feeding line and the ground line extend belong the peripheral region of the cell array block.

It is a still further object of the present invention to provide a novel semiconductor memory device free from the above problems.

It is yet a further object of the present invention to provide a novel semiconductor memory device having a triple well structure and double layered interconnections, wherein a bottom interconnection serves as a signal interconnection, whilst a top interconnection serves as a power line or a ground line, wherein the layout is optimum to realize a possible shrinkage by preventing and avoiding that the internal power feeding line and the ground line extend belong the peripheral region of the cell array block.

The present invention provides a layout structure of an interconnection which feeds a fixed voltage level to a sense amplifier provided in a cell array block of a semiconductor memory device, wherein the interconnection selectively extends only an inside of an outside edge of a second conductivity type outside well region provided along one peripheral side of a first conductivity type well region, in which the cell array block is provided.

The present invention also provides a layout structure of a sense amplifier bank provided outside of a memory cell region of a semiconductor memory device, wherein the sense amplifier bank selectively extends both a first conductivity type sub-well region and an adjacent first side region of a second conductivity type isolation well which defines a memory cell region, and the first conductivity type sub-well region is defined between a second conductivity type outside well region and the first side region of the second conductivity type isolation well.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
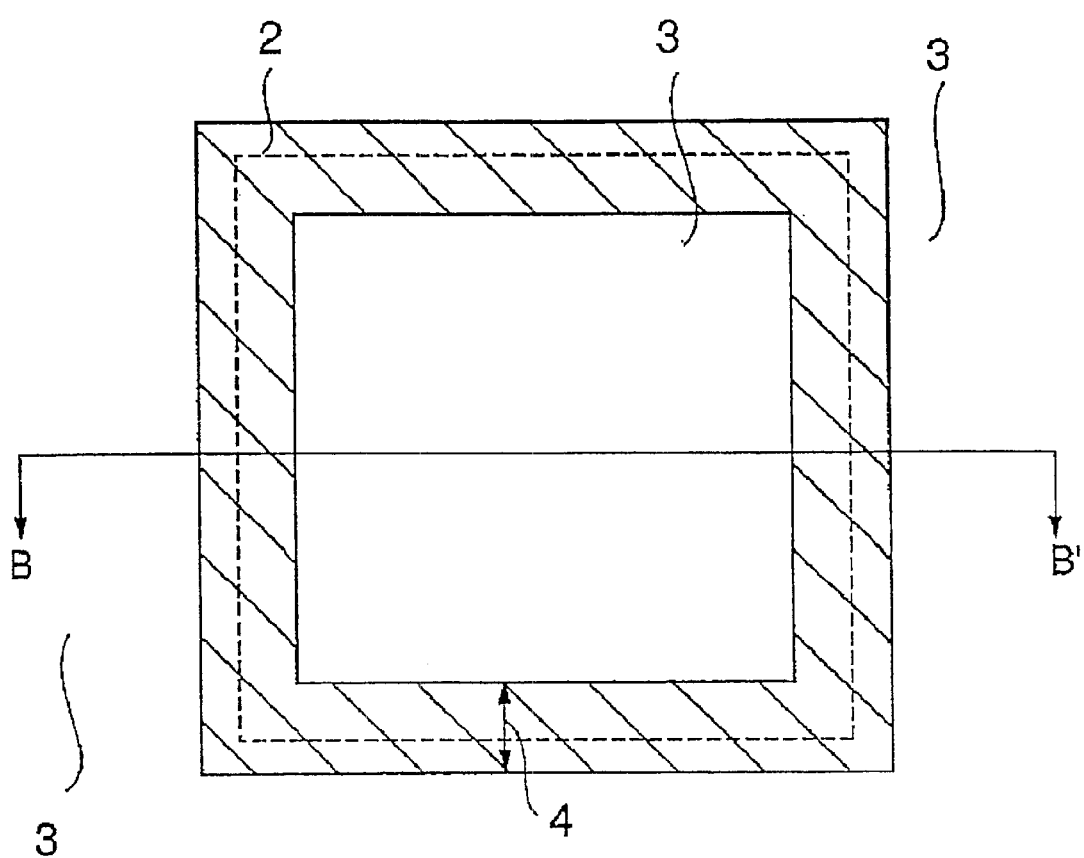
FIG. 1A is a fragmentary plane view illustrative of the conventional triple well structure for DRAM.
Figure 1B:
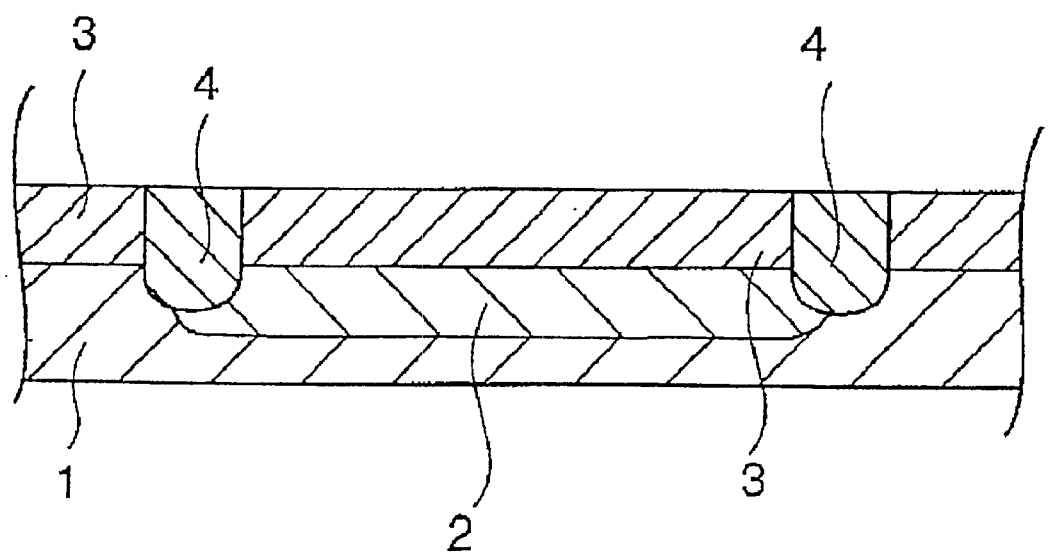
FIG. 1B is a fragmentary cross sectional elevation view illustrative of the conventional triple well structure for DRAM taken along a B–B' line of FIG. 1A.
Figure 2:
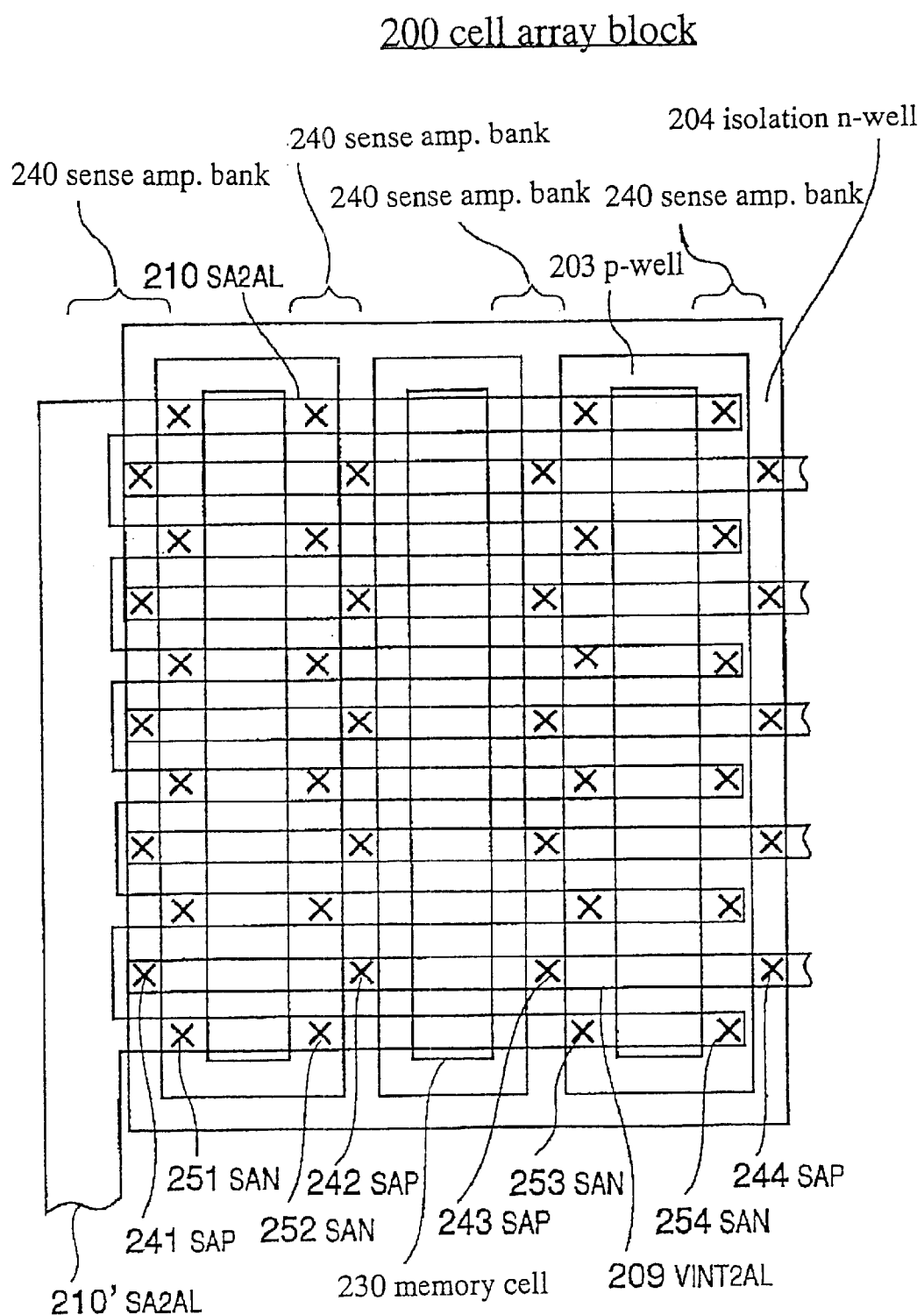
FIG. 2 is a fragmentary plane view illustrative of a cell array block having the conventional triple well structure shown in FIGS. 1A and 1B.
Figure 3A:
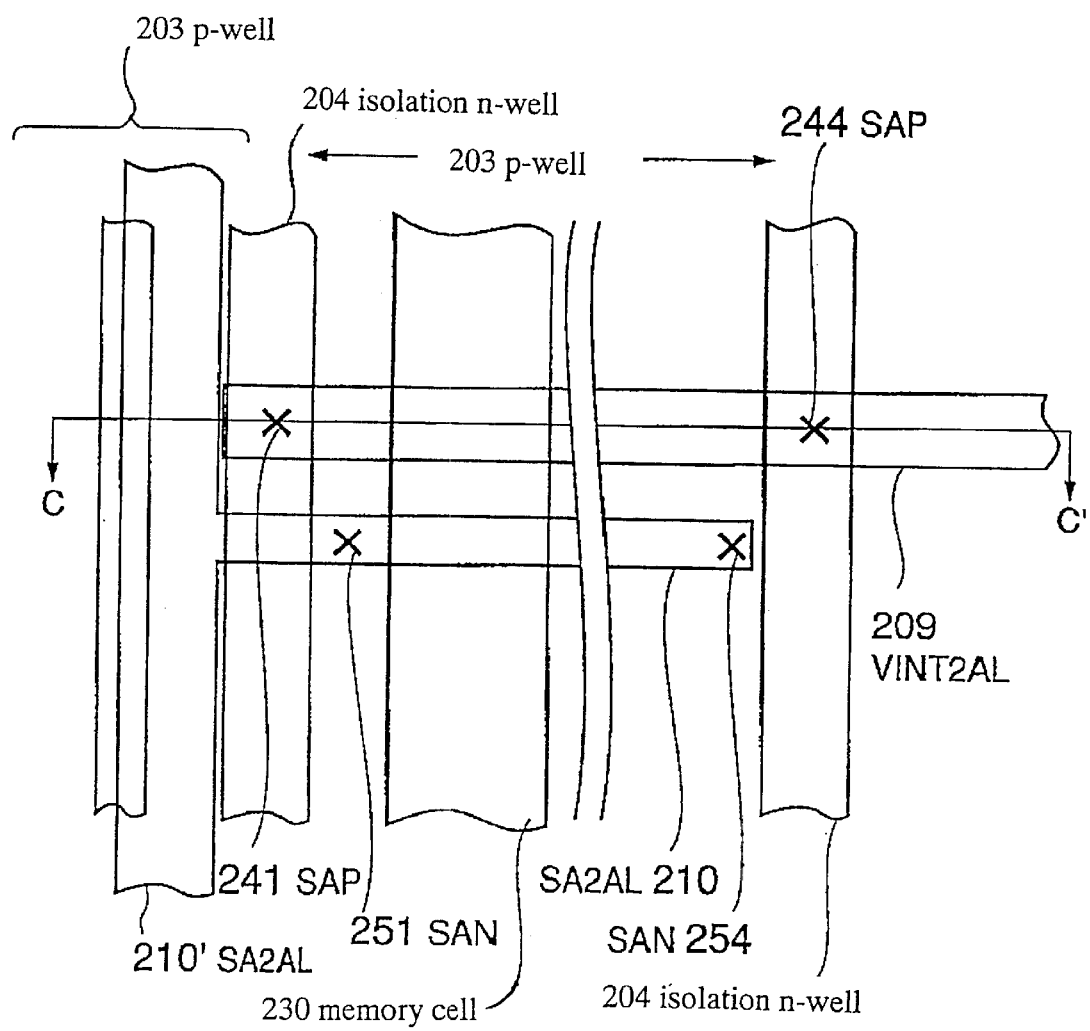
FIG. 3A is a fragmentary enlarged plane view illustrative of the left side region of the cell array block shown in FIG. 2.
Figure 3B:
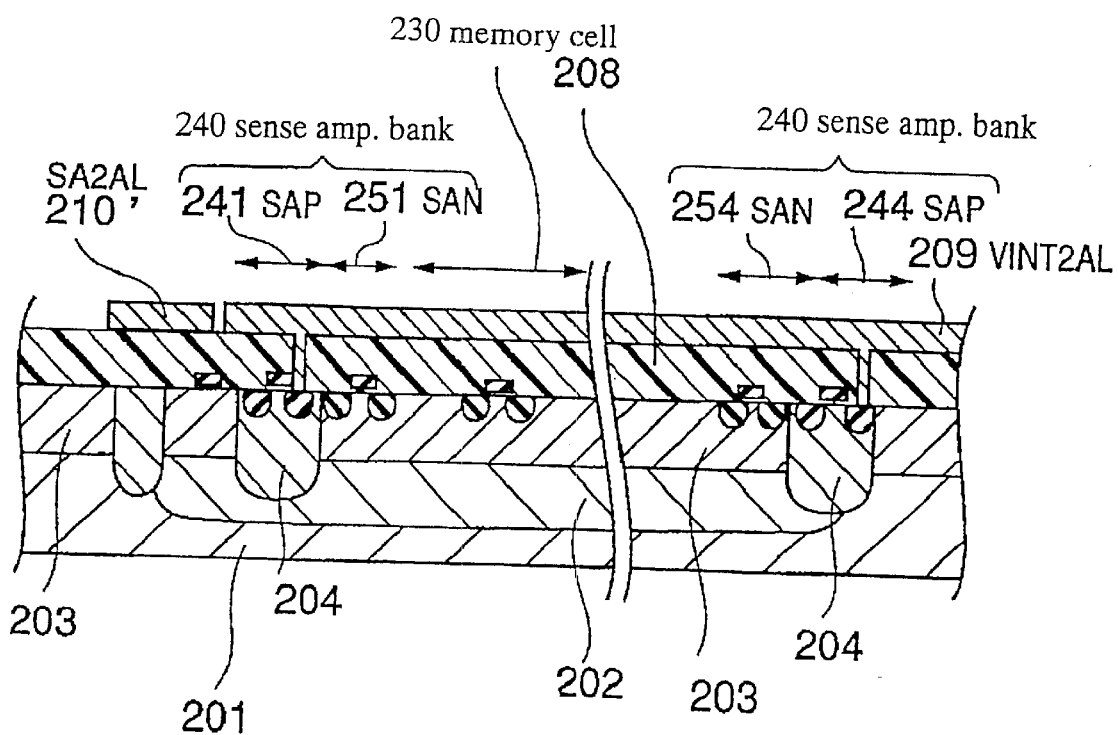
FIG. 3B is a fragmentary enlarged cross sectional elevation view taken along a C–C' line of FIG. 3A.

The first present invention provides a layout structure of an interconnection which feeds a fixed voltage level to a sense amplifier provided in a cell array block of a semiconductor memory device, wherein the interconnection selectively extends only an inside of an outside edge of a second conductivity type outside well region provided along one peripheral side of a first conductivity type well region, in which the cell array block is provided.

It is preferable that the second conductivity type outside well region is free of any transistors for a sense amplifier bank.

It is further preferable that a second conductivity type isolation well is provided, which defines a memory cell region, and a first side region of the second conductivity type isolation well has first conductivity type transistors for the sense amplifier bank, and the first side region of the second conductivity type isolation well is separated from the second conductivity type outside well region by a first conductivity type sub-well region of the first conductivity type well region, and the first conductivity type sub-well region is defined between the second conductivity type outside well region and the first side region of the second conductivity type isolation well, and the first conductivity type sub-well region has second conductivity type transistors for the sense amplifier bank.

It is further more preferable that a second conductivity type deep well region extends on a bottom of the first conductivity type well region and also extends on a bottom the first conductivity type sub-well region, and a first side of the second conductivity type deep well region is terminated by the second conductivity type outside well region, and a bottom of the second conductivity type isolation well reaches the second conductivity type deep well region.

It is moreover preferable that the sense amplifier bank is selectively provided within both the first conductivity type sub-well region and the first side region of the second conductivity type isolation well.

It is also preferable that the fixed voltage level is a ground voltage level.

The second present invention provides a layout structure of a sense amplifier bank provided outside of a memory cell region of a semiconductor memory device, wherein the sense amplifier bank selectively extends both a first conductivity type sub-well region and an adjacent first side region of a second conductivity type isolation well which defines a memory cell region, and the first conductivity type sub-well region is defined between a second conductivity type outside well region and the first side region of the second conductivity type isolation well.

It is preferable that the first side region of the second conductivity type isolation well has first conductivity type transistors for the sense amplifier bank, and the first conductivity type sub-well region has second conductivity type transistors for the sense amplifier bank.

It is further preferable that the second conductivity type outside well region is free of any transistors for the sense amplifier bank.

It is further more preferable that a second conductivity type deep well region extends on a bottom of the first conductivity type well region and also extends on a bottom the first conductivity type sub-well region, and a first side of the second conductivity type deep well region is terminated by the second conductivity type outside well region, and a bottom of the second conductivity type isolation well reaches the second conductivity type deep well region.

It is also preferable that an interconnection selectively extends only an inside of an outside edge of the second conductivity type outside well region.

It is also preferable that the fixed voltage level is a ground voltage level.

The third present invention provides a semiconductor memory device having an interconnection which feeds a fixed voltage level to a sense amplifier provided in a cell array block, wherein the interconnection selectively extends only an inside of an outside edge of a second conductivity type outside well region provided along one peripheral side of a first conductivity type well region, in which the cell array block is provided.

It is preferable that the second conductivity type outside well region is free of any transistors for a sense amplifier bank.

It is preferable that a second conductivity type isolation well is provided, which defines a memory cell region, and a first side region of the second conductivity type isolation well has first conductivity type transistors for the sense amplifier bank, and the first side region of the second conductivity type isolation well is separated from the second conductivity type outside well region by a first conductivity type sub-well region of the first conductivity type well region, and the first conductivity type sub-well region is defined between the second conductivity type outside well region and the first side region of the second conductivity type isolation well, and the first conductivity type sub-well region has second conductivity type transistors for the sense amplifier bank.

It is preferable that a second conductivity type deep well region extends on a bottom of the first conductivity type well region and also extends on a bottom the first conductivity type sub-well region, and a first side of the second conductivity type deep well region is terminated by the second conductivity type outside well region, and a bottom of the second conductivity type isolation well reaches the second conductivity type deep well region.

It is preferable that the sense amplifier bank is selectively provided within both the first conductivity type sub-well region and the first side region of the second conductivity type isolation well.

It is preferable that the fixed voltage level is a ground voltage level.

The fourth present invention provides a semiconductor memory device having a sense amplifier bank provided outside of a memory cell region, wherein the sense amplifier bank selectively extends both a first conductivity type sub-well region and an adjacent first side region of a second conductivity type isolation well which defines a memory cell region, and the first conductivity type sub-well region is defined between a second conductivity type outside well region and the first side region of the second conductivity type isolation well.

It is preferable that the first side region of the second conductivity type isolation well has first conductivity type transistors for the sense amplifier bank, and the first conductivity type sub-well region has second conductivity type transistors for the sense amplifier bank.

It is preferable that the second conductivity type outside well region is free of any transistors for the sense amplifier bank.

It is preferable that a second conductivity type deep well region extends on a bottom of the first conductivity type well region and also extends on a bottom the first conductivity type sub-well region, and a first side of the second conductivity type deep well region is terminated by the second conductivity type outside well region, and a bottom of the second conductivity type isolation well reaches the second conductivity type deep well region.

It is preferable that an interconnection selectively extends only an inside of an outside edge of the second conductivity type outside well region.

It is preferable that the fixed voltage level is a ground voltage level.

PREFERRED EMBODIMENT

Figure 4:
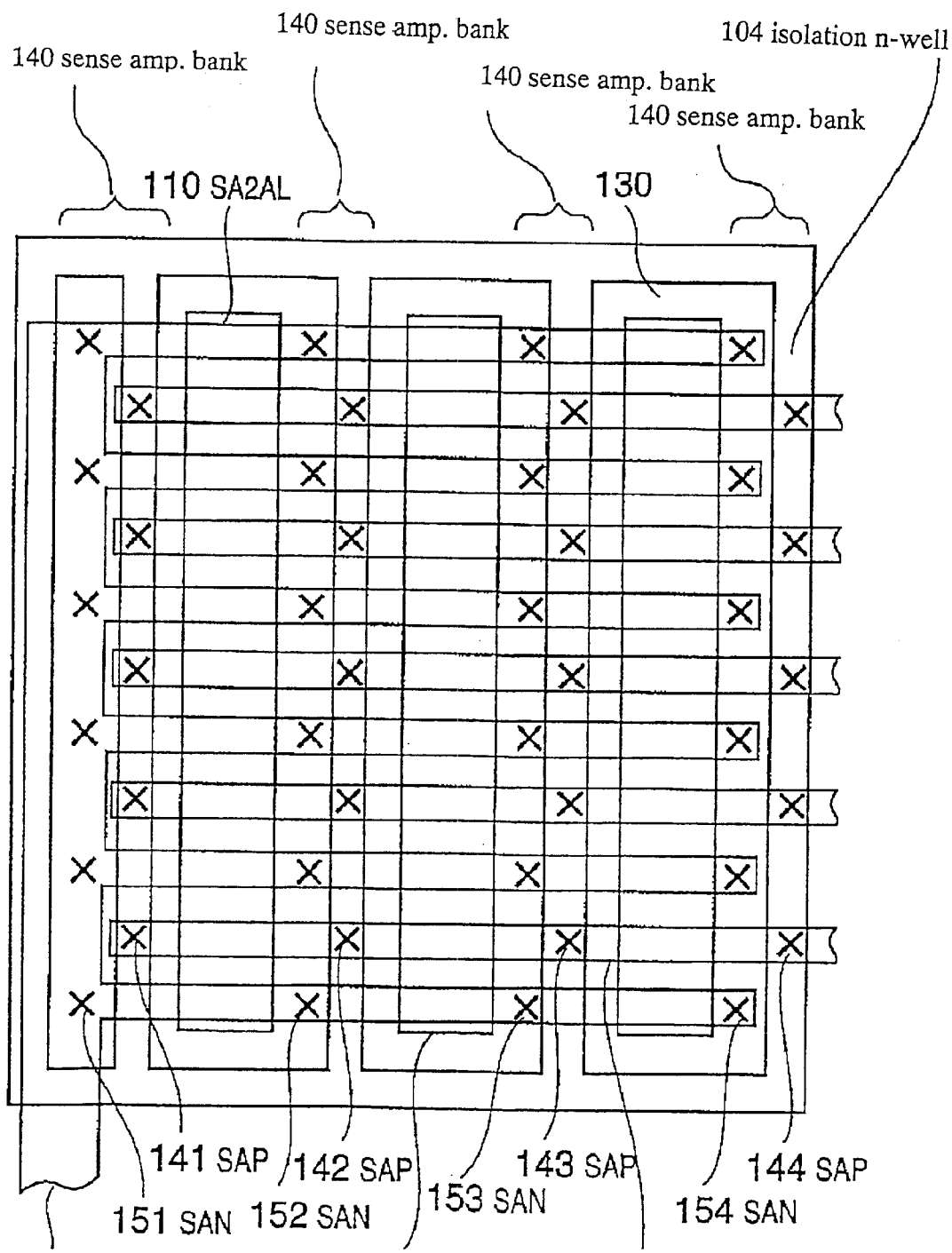
FIG. 4 is a fragmentary plane view illustrative of a cell array block of a novel semiconductor memory device in a first preferred embodiment in accordance with the present invention.
Figure 5A:
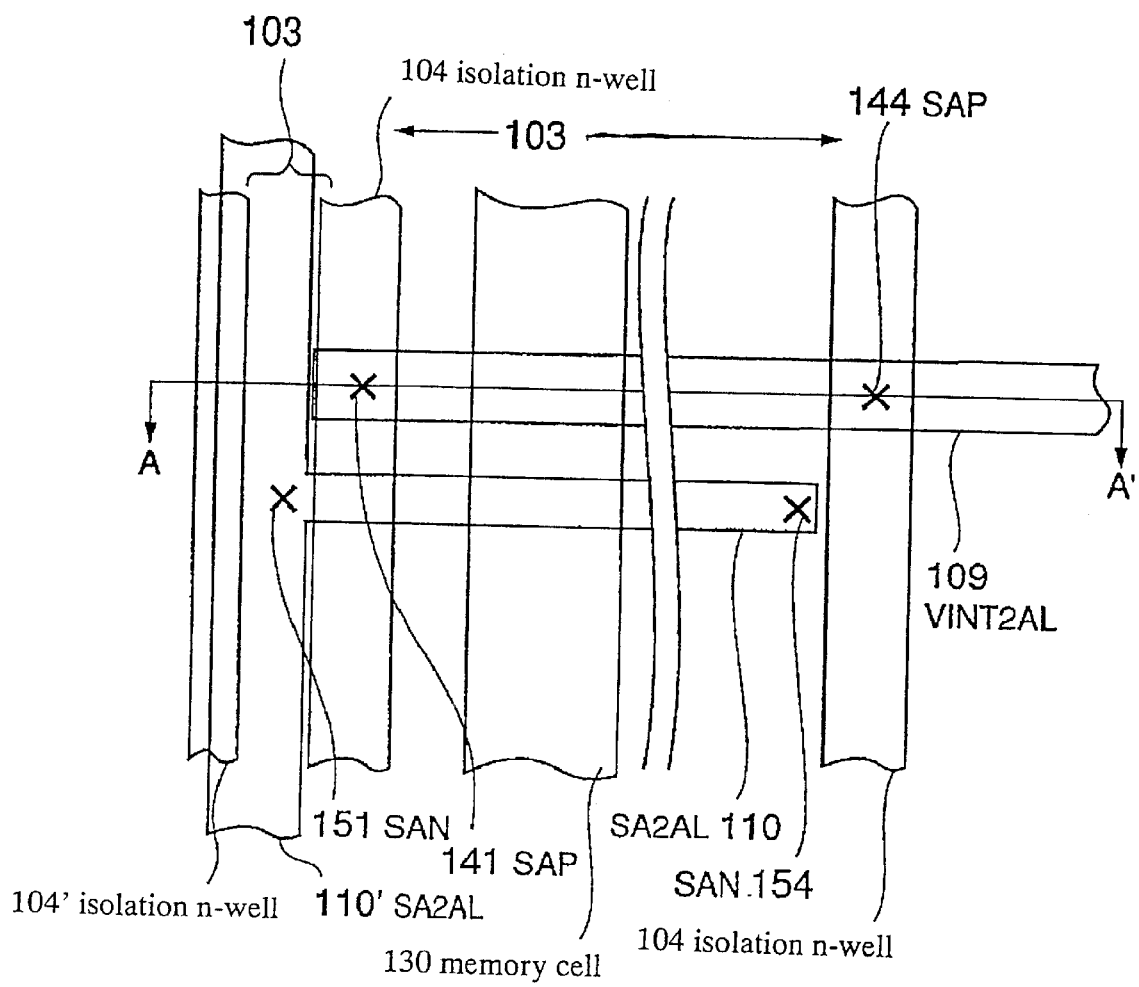
FIG. 5A is a fragmentary enlarged plane view illustrative of a left side region of the cell array block of FIG. 4.
Figure 5B:
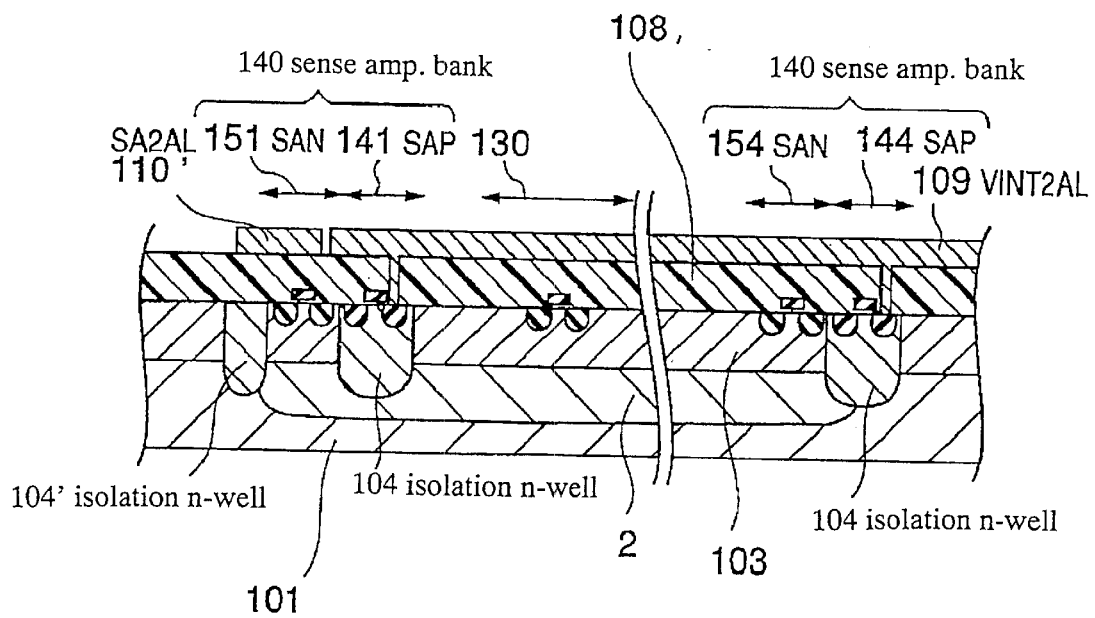
FIG. 5B is a fragmentary enlarged cross sectional elevation view illustrative of the left side region of the cell array block taken along an A–A' line of FIG. 5B.

A first embodiment according to the present invention will be described in detail with reference to the drawings. In accordance with the present invention, a semiconductor memory device having a triple well structure and double layered interconnections comprising a bottom interconnection serving as a signal interconnection and a top interconnection serving as a power line or a ground line, wherein a layout of transistors for a sense amplifier bank arranged in a cell array block is changed to shrink the cell array block. FIG. 4 is a fragmentary plane view illustrative of a cell array block of a novel semiconductor memory device in a first preferred embodiment in accordance with the present invention. FIG. 5A is a fragmentary enlarged plane view illustrative of a left side region of the cell array block of FIG. 4. FIG. 5B is a fragmentary enlarged cross sectional elevation view illustrative of the left side region of the cell array block taken along an A–A' line of FIG. 5B.

With reference to FIG. 4, a cell array block 100 has the following structure. An n-type isolation well region 104 is provided for isolating the cell array block 100 from a peripheral region in the triple well structure, in order to protect the cell array block 100 from noises from the peripheral region. Sense amplifier bank n-type transistors SAN151, 152, 153 and 154 for forming a sense amplifier bank 140 are provided in a p-well 103 which is isolated by the n-type isolation well region 104 from the peripheral region. N-type transistors for memory cells 130 are also provided for the p-well 103. Sense amplifier bank p-type transistors SAP141, 142, 143 and 144 for forming the sense amplifier bank 140 are provided in the n-type isolation well region 104. A deep n-well 102 is selectively formed in a p-type semiconductor substrate 101. The memory cell array block 100 comprises the deep n-well 102, the p-well 103 and the n-type isolation well region 104. The deep n-well 102 is deeper than the p-well 103 and the n-type isolation well region 104.

A top layered aluminum interconnection VINT2AL 109 is provided for internally feeding a power voltage to the sense amplifier bank p-type transistors SAP141, 142, 143 and 144. A top layered aluminum interconnection SA2AL 110 is provided for internally feeding a ground voltage to the sense amplifier bank n-type transistors SAN151, 152, 153 and 154. The top layered aluminum interconnection SA2AL 110 is needed to have a width which is sufficiently large for reducing the interconnection resistance which depends on a distance to an external connective terminal.

The sense amplifier bank p-type transistors SAP141, 142, 143 and 144 are not provided in the left side region or the outside region of the n-type isolation well region 104. The sense amplifier bank p-type transistors SAP141, 142, 143 and 144 are provided in the inside region of the n-type isolation well region 104, for which reason the top layered aluminum interconnection VINT2AL 109 for internally feeding a power voltage to the sense amplifier bank p-type transistors SAP141, 142, 143 and 144 are terminated inside of the cell array block 100 and thus do not extend beyond the cell array block 100. As a result, the top layered aluminum interconnection SA2AL 110' for internally feeding the ground voltage to the sense amplifier bank n-type transistors SAN151, 152, 153 and 154 are also terminated inside of the n-type isolation well region 104'. This layout allows a further shrinkage of the cell array block.

In the p-well 103 formed over the deep n-well 102 in the cell array region, the memory cells 130 and the sense amplifier bank n-type transistors SAN151, 152, 153 and 154 for the sense amplifier bank 140. The n-type isolation well region 104 extends along the peripheral sides of the p-well 103. The sense amplifier bank p-type transistors SAP141, 142, 143 and 144 for the sense amplifier bank 140 are provided in the n-type isolation well region 104, provided that the sense amplifier bank p-type transistors SAP141, 142, 143 and 144 are not provided in the n-type isolation well region 104' in the side of the top layered aluminum interconnection SA2AL 110' for internally feeding the ground voltage to the sense amplifier bank n-type transistors SAN151, 152, 153 and 154.

The n-type isolation well region 104' is positioned outside or left side of the left side region of the n-type isolation well region 104. The sense amplifier bank p-type transistors SAP141, 142, 143 and 144 for the sense amplifier bank 140 are provided in the n-type isolation well region 104, provided that the sense amplifier bank p-type transistors SAP141, 142, 143 and 144 are not provided in the n-type isolation well region 104'. The sense amplifier bank n-type transistors SAN151, 152, 153 and 154 are provided in the inside region of the p-well 103 from the n-type isolation well region 104'. The sense amplifier bank n-type transistors SAN151, 152, 153 and 154 are not provided outside region of the p-well 103 from the n-type isolation well region 104'. Namely, the sense amplifier bank n-type transistor SAN151 is provided in the first region of the p-well 103 which is positioned outside of a left side region of the n-type isolation well region 104 and inside of the n-type isolation well region 104'. The sense amplifier bank p-type transistor SAN141 is provided in the left side region of the n-type isolation well region 104. N-type transistors for the memory cells 130 are provided in the second region of the p-well 103 which is surrounded or defined by the n-type isolation well region 104. In FIG. 5B, the second region of the p-well 103 is ranged between the left side region and the right side region of the n-type isolation well region 104. The sense amplifier bank p-type transistor SAN141 is provided in the right side region of the n-type isolation well region 104. The top layered aluminum interconnection VINT2AL 109 is provided for internally feeding the power voltage to the sense amplifier bank p-type transistors SAP141, 142, 143 and 144 for the sense amplifier bank 140. The top layered aluminum interconnection SA2AL 110 is provided for internally feeding a ground voltage to the sense amplifier bank n-type transistors SAN151, 152, 153 and 154. The mark "X" represents a contact position where a diffusion region of the transistor. For example, the "X-151SAN" represents the contact position where the top layered aluminum interconnection SA2AL 110' is contact with the diffusion region of the sense amplifier bank n-type transistor SAN151. The "X-141SAP" represents the contact position where the top layered aluminum interconnection VINT2AL 109 is contact with the diffusion region of the sense amplifier bank p-type transistor SAP141. The "X-154SAN" represents the contact position where the top layered aluminum interconnection SA2AL 110 is contact with the diffusion region of the sense amplifier bank n-type transistor SAN154. The "X-144SAP" represents the contact position where the top layered aluminum interconnection VINT2AL 109 is contact with the diffusion region of the sense amplifier bank p-type transistor SAP144. The top layered aluminum interconnection SA2AL 110' is provided for internally feeding a ground voltage to the sense amplifier bank n-type transistors SAN151, 152, 153 and 154 of the sense amplifier bank 140. The top layered aluminum interconnection SA2AL 110' extends over an inter-layer insulator 108 so that the top layered aluminum interconnection SA2AL 110' is positioned over the n-type isolation well region 104 and the sense amplifier bank n-type transistor SAN151. The top layered aluminum interconnection SA2AL 110' has a contact with the diffusion region of the sense amplifier bank n-type transistor SAN151. The top layered aluminum interconnection SA2AL 110' is also connected with the top layered aluminum interconnection SA2AL 110 which has a contact with the diffusion region of the sense amplifier bank n-type transistor SAN154 which is provided in the second region of the p-well 103 between the left side region and the right side region of the n-type isolation well region 104. The top layered aluminum interconnection SA2AL 110' is needed to have a width which is sufficiently large for reducing the interconnection resistance which depends on a distance to a ground terminal.

As described above, the n-type isolation well region 104' is positioned outside or left side of the left side region of the n-type isolation well region 104. The sense amplifier bank p-type transistors SAP 141, 142, 143 and 144 for the sense amplifier bank 140 are provided in the n-type isolation well region 104, provided that the sense amplifier bank p-type transistors SAP141, 142, 143 and 144 are not provided in the n-type isolation well region 104'. The sense amplifier bank n-type transistors SAN151, 152, 153 and 154 are provided in the inside region of the p-well 103 from the n-type isolation well region 104'. The sense amplifier bank n-type transistors SAN151, 152, 153 and 154 are not provided outside region of the p-well 103 from the n-type isolation well region 104'. Namely, the sense amplifier bank n-type transistor SAN151 is provided in the first region of the p-well 103 which is positioned outside of a left side region of the n-type isolation well region 104 and inside of the n-type isolation well region 104'. The sense amplifier bank p-type transistor SAN141 is provided in the left side region of the n-type isolation well region 104. N-type transistors for the memory cells 130 are provided in the second region of the p-well 103 which is surrounded or defined by the n-type isolation well region 104. In FIG. 5B, the second region of the p-well 103 is ranged between the left side region and the right side region of the n-type isolation well region 104. The sense amplifier bank p-type transistor SAN141 is provided in the right side region of the n-type isolation well region 104. The top layered aluminum interconnection VINT2AL 109 for internally feeding a power voltage to the sense amplifier bank p-type transistors SAP141, 142, 143 and 144 are terminated inside of the cell array block 100 and thus do not extend beyond the cell array block 100. As a result, the top layered aluminum interconnection SA2AL 110'for internally feeding the ground voltage to the sense amplifier bank n-type transistors SAN151, 152, 153 and 154 are also terminated inside of the n-type isolation well region 104'. This layout allows a further shrinkage of the cell array block.

In a semiconductor device having a triple well structure, the interconnection for feeding the ground voltage to the sense amplifier is shifted in position into the inside of the cell array block. In case of a single bank structure comprising a single cell array block, a shrinkage of about 10 micrometers to the cell array block is obtained. In case of four bank structure comprising 2×2 cell array blocks, a shrinkage of about 20 micrometers to the cell array block is obtained in the first and second directions perpendicular to each other. In case of 128M-bits memory, the obtained chip size reduction is about 0.41 mm$^2$. In case of 256M-bits memory, the obtained chip size reduction is about 0.33 mm$^2$.

As a modification to the above embodiment, it is possible to provide the n-type isolation well region 104'free of the p-type transistors for the sense amplifier not only in the left side of the memory cell array block but also in the right side of the memory cell array block. If the interconnections for feeding the ground voltage to the sense amplifier are provided in both the left and right sides of the cell array block, then the effect of the shrinkage of the chip side is double of the above described embodiment, wherein the interconnection is provided only in the left side of the cell array block.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A layout structure of an interconnection which feeds a fixed voltage level to a sense amplifier provided in a cell array block of a semiconductor memory device,
    wherein the interconnection selectively extends only on an inside of an outer edge of a second conductivity type outside well region provided along one peripheral side of a first conductivity type well region, in which the cell array block is provided;
    wherein the second conductivity type outside well region is free of any transistors for a sense amplifier bank;
    wherein a second conductivity type isolation well is provided, which defines a memory cell region, and a first side region of the second conductivity type isolation well has first conductivity type transistors for the sense amplifier bank, and the first side region of the second conductivity type isolation well is separated from the second conductivity type outside well region by a first conductivity type sub-well region of the first conductivity type well region, and the first conductivity type sub-well region is defined between the second conductivity type outside well region and the first side region of the second conductivity type isolation well, and the first conductivity type sub-well region has second conductivity type transistors for the sense amplifier bank; and
    wherein a second conductivity type deep well region extends on a bottom of the first conductivity type well region and also extends on a bottom the first conductivity type sub-well region, and a first side of the second conductivity type deep well region is terminated by the second conductivity type outside well region, and a bottom of the second conductivity type isolation well reaches the second conductivity type deep well region.

2. The layout structure as claimed in claim 1, wherein the sense amplifier bank is selectively provided within both the first conductivity type sub-well region and the first side region of the second conductivity type isolation well.

3. The layout structure as claimed in claim 1, wherein the fixed voltage level is a ground voltage level.

4. A layout structure of a sense amplifier bank provided outside of a memory cell region of a semiconductor memory device,
   wherein the sense amplifier bank selectively extends both a first conductivity type sub-well region and an adjacent first side region of a second conductivity type isolation well which defines a memory cell region, and the first conductivity type sub-well region is defined between a second conductivity type outside well region and the first side region of the second conductivity type isolation well;
   wherein the first side region of the second conductivity type isolation well has first conductivity type transistors for the sense amplifier bank, and the first conductivity type sub-well region has second conductivity type transistors for the sense amplifier bank;
   wherein the second conductivity type outside well region is free of any transistors for the sense amplifier bank; and
   wherein a second conductivity type deep well region extends on a bottom of the first conductivity type well region and also extends on a bottom the first conductivity type sub-well region, and a first side of the second conductivity type deep well region is terminated by the second conductivity type outside well region, and a bottom of the second conductivity type isolation well reaches the second conductivity type deep well region.

5. The layout structure as claimed in claim 4, wherein an interconnection selectively extends only on an inside of an outer edge of the second conductivity type outside well region.

6. The layout structure as claimed in claim 4, wherein the fixed voltage level is a ground voltage level.

7. A semiconductor memory device having an interconnection which feeds a fixed voltage level to a sense amplifier provided in a cell array block,
   wherein the interconnection selectively extends only on an inside of an outer edge of a second conductivity type outside well region provided along one peripheral side of a first conductivity type well region, in which the cell array block is provided;
   wherein the second conductivity type outside well region is free of any transistors for a sense amplifier bank;
   wherein a second conductivity type isolation well is provided, which defines a memory cell region, and a first side region of the second conductivity type isolation well has first conductivity type transistors for the sense amplifier bank, and the first side region of the second conductivity type isolation well is separated from the second conductivity type outside well region by a first conductivity type sub-well region of the first conductivity type well region, and the first conductivity type sub-well region is defined between the second conductivity type outside well region and the first side region of the second conductivity type isolation well, and the first conductivity type sub-well region has second conductivity type transistors for the sense amplifier bank; and
   wherein a second conductivity type deep well region extends on a bottom of the first conductivity type well region and also extends on a bottom the first conductivity type sub-well region, and a first side of the second conductivity type deep well region is terminated by the second conductivity type outside well region, and a bottom of the second conductivity type isolation well reaches the second conductivity type deep well region.

8. The semiconductor memory device as claimed in claim 7, wherein the sense amplifier bank is selectively provided within both the first conductivity type sub-well region and the first side region of the second conductivity type isolation well.

9. The semiconductor memory device as claimed in claim 7, wherein the fixed voltage level is a ground voltage level.

10. A semiconductor memory device having a sense amplifier bank provided outside of a memory cell region,
    wherein the sense amplifier bank selectively extends both a first conductivity type sub-well region and an adjacent first side region of a second conductivity type isolation well which defines a memory cell region, and the first conductivity type sub-well region is defined between a second conductivity type outside well region and the first side region of the second conductivity type isolation well;
    wherein the first side region of the second conductivity type isolation well has first conductivity type transistors for the sense amplifier bank, and the first conductivity type sub-well region has second conductivity type transistors for the sense amplifier bank;
    wherein the second conductivity type outside well region is free of any transistors for the sense amplifier bank; and
    wherein a second conductivity type deep well region extends on a bottom of the first conductivity type well region and also extends on a bottom the first conductivity type sub-well region, and a first side of the second conductivity type deep well region is terminated by the second conductivity type outside well region, and a bottom of the second conductivity type isolation well reaches the second conductivity type deep well region.

11. The semiconductor memory device as claimed in claim 10, wherein an interconnection selectively extends only on an inside of an outer edge of the second conductivity type outside well region.

12. The semiconductor memory device as claimed in claim 10, wherein the fixed voltage level is a ground voltage level.

13. A cell array block comprising:
    a well region having a first conductivity type;
    an outside well region having a second conductivity type buried in the well region, the outside well region completely surrounding the well region, the outside well region comprising a plurality of outer walls surrounding the well region, the outside well region also comprising at least one inner wall extending between two of the outer walls and dividing the well region into sub-well regions of the first conductivity type;
    a plurality of sense amplifier bank transistors arranged in the well region;
    an interconnect overlying the well region and the outside well region, the interconnect having a first portion arranged generally parallel to the at least one inner wall, the interconnect also comprising at least one second region extending generally perpendicular to the at least one inner wall, the first portion of the interconnect directly overlying and being in electrical contact with at least one of the sense amplifier transistors in the well region;
    wherein the first portion of the interconnect is contained within a perimeter of the outside well region.

14. The cell array block of claim 13, further comprising a second conductivity type deep well region arranged in contact with an underside of each of the well region and the outside well region.

15. The cell array block of claim 14, wherein the second conductivity type deep well region extends continuously under an entirety of the well region contained within the outside well region.

* * * * *